(12) United States Patent
Zheng et al.

(10) Patent No.: US 8,837,135 B2
(45) Date of Patent: Sep. 16, 2014

(54) EXPANSION MODULE FOR INTERFACE CARD, COMPUTER CASE ASSEMBLY, AND COMPUTER SYSTEM

(75) Inventors: Yong-Liang Zheng, New Taipei (TW); Hung-Chun Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 374 days.

(21) Appl. No.: 13/336,504

(22) Filed: Dec. 23, 2011

(65) Prior Publication Data

US 2013/0088831 A1 Apr. 11, 2013

(30) Foreign Application Priority Data

Oct. 8, 2011 (CN) .......................... 2011 1 0301786

(51) Int. Cl.
*G06F 1/16* (2006.01)
*H05K 7/14* (2006.01)
*H05K 7/02* (2006.01)
*G06F 1/18* (2006.01)

(52) U.S. Cl.
CPC ................ *G06F 1/185* (2013.01); *G06F 1/186* (2013.01)
USPC ................ 361/679.32; 361/679.31; 361/801; 361/802; 361/810

(58) Field of Classification Search
CPC . H05K 7/1421; H05K 7/1422; H05K 7/1424; H05K 7/1402; H05K 7/1425
USPC ............... 361/679.31–679.32, 724–727, 756, 361/752, 732, 790, 797, 800–803, 796, 361/728–730, 807, 809, 810
See application file for complete search history.

(56) References Cited

U.S. PATENT DOCUMENTS

| | | | |
|---|---|---|---|
| 6,118,668 A * | 9/2000 | Scholder et al. | 361/753 |
| 6,373,691 B1 | 4/2002 | Chen | |
| 7,123,470 B2 * | 10/2006 | Hsu et al. | 361/679.02 |

(Continued)

FOREIGN PATENT DOCUMENTS

| | | | |
|---|---|---|---|
| TW | M263722 U | | 5/2005 |
| TW | I329485 | | 8/2010 |
| TW | 405093 U | * | 6/2011 |
| TW | M405093 U | | 6/2011 |

OTHER PUBLICATIONS

Taiwan Patent Office, Office Action, Patent Application Serial No. TW100136958, Oct. 17, 2013, Taiwan.

*Primary Examiner* — Nidhi Desai
(74) *Attorney, Agent, or Firm* — Rabin & Berdo, P.C.

(57) ABSTRACT

An expansion module for an interface card includes a transfer circuit-board, an expansion slot, a bottom-plate, a lateral-frame, and a latch. The transfer circuit-board has an electrical connector to be inserted into a card slot of a main circuit-board. The expansion slot is disposed on the transfer circuit-board and used for the interface card to be inserted into it, so as to connect the interface card to the main circuit-board. The transfer circuit-board is mounted onto the bottom-plate. The lateral-frame extends from the bottom-plate to define an accommodating space between the bottom-plate and the lateral-frame, and the transfer circuit-board is located in the accommodating space. The latch is pivoted to the lateral-frame and moves between a releasing position and a latching position. The latch has a first clamping element, and at the latching position the latch clamps and fixes the interface card with the first clamping element.

17 Claims, 11 Drawing Sheets

(56) References Cited

U.S. PATENT DOCUMENTS

| | | |
|---|---|---|
| 7,639,488 B2 | 12/2009 | Tu |
| 8,254,145 B2 * | 8/2012 | Hsieh et al. .................. 361/807 |
| 8,379,399 B2 * | 2/2013 | Chiu et al. .................. 361/759 |
| 8,472,210 B2 * | 6/2013 | Chiu et al. .................. 361/801 |
| 8,625,271 B2 * | 1/2014 | Lu et al. .................. 361/679.32 |
| 2005/0276004 A1 | 12/2005 | Hsu et al. |

* cited by examiner

EXPANSION MODULE FOR INTERFACE CARD, COMPUTER CASE ASSEMBLY, AND COMPUTER SYSTEM

CROSS-REFERENCES TO RELATED APPLICATIONS

This non-provisional application claims priority under 35 U.S.C. §119(a) on Patent Application No. 201110301786.7 filed in China on Aug. 10, 2011, the entire contents of which are hereby incorporated by reference.

BACKGROUND

1. Technical Field

This disclosure relates to an expansion module for an interface card, and more particularly to an expansion module, a computer case assembly having the expansion module, and a computer system having the expansion module.

2. Related Art

A common motherboard of a computer system includes various card slots. These card slots are used to be inserted by different interface cards. A common method of installing an interface card is that the interface card is arranged perpendicular to the motherboard, and the card-edge connector of the interface card is directly inserted into the card slot.

However, in a slim type computer, such as 1 U blade severs, the height inside the inner space of the computer case is small, and it is difficult to arrange the interface card perpendicular to the motherboard. Alternatively, a transfer circuit-board is inserted into the card slot at first, and then the card-edge connector of the interface card is inserted into the expansion slot of the transfer circuit-board. Therefore, the interface card is arranged in parallel to the motherboard to solve problems caused by the small height of the computer case. For example, US Utility patent U.S. Pat. No. 6,373,691 B1 and R. O. C. (Taiwan) Invention Patent I329485 (also disclosed as U.S. Pat. No. 7,639,488 B2) disclose the approaches of connecting the interface card to the motherboard through a transfer circuit-board connected to the motherboard.

In U.S. Pat. No. 6,373,691 or I329,485, the computer case is a desktop case and the interface card is set in horizontal direction. In the case of an interface card without exposed I/O ports, usually there is no mechanical connection between the interface card and the computer case; such an interface card is only fixed and supported by the combination of forces between the interface card and the expansion slot. Under such a condition, the interface card usually behaves like a cantilever beam. The interface card swivels toward the motherboard and poor contact/connection results when vibration/shock/gravitational force is applied to the interface card. Poor contact/connection makes the computer system unstable. Even more seriously, the interface card could escape from the expansion card, resulting in computer system malfunction.

SUMMARY

In the related art, when an interface card is connected to the motherboard via a transfer circuit-board, the interface card is only supported by the mechanical connection between the interface card and the expansion slot. The support of such a mechanical connection is weak, typically resulting in poor contact/connection, or the interface card escaping completely from the expansion slot.

Embodiments of this disclosure are directed to an expansion module, a computer case assembly, and a computer system, in which the interface card is firmly fixed to solve the problem of weak support when the interface card is connected to the motherboard via a transfer circuit-board.

One or more embodiment of this disclosure provides an expansion module for fixing an interface card and connecting the interface card electrically to a main circuit-board. The main circuit-board includes at least one card slot the interface card. The expansion module includes a transfer circuit-board, an expansion slot, a carrier body, and a latch.

The transfer circuit-board includes an electrical connector disposed at an edge of the transfer circuit-board. The electrical connector is used to be inserted into the card slot. The expansion slot is disposed on the transfer circuit-board and is connected electrically to the electrical connector. The expansion slot is provided into which the interface card can be inserted and connected electrically to the main circuit-board.

The carrier body provides an accommodating space for accommodating the interface card. The carrier body includes a bottom-plate and a lateral-frame. The transfer circuit-board is mounted onto the bottom-plate and located in the accommodating space. The lateral-frame extends from the bottom-plate to define the accommodating space between the bottom-plate and the lateral-frame.

The latch is pivoted to the lateral-frame and moves between a releasing position and a latching position. The latch includes a first clamping element. In the latching position, the latch clamps and fixes the interface card with the first clamping element, so as to provide additional support to prevent the interface card from swiveling or escaping from the expansion slot.

One or more embodiment of this disclosure further provides a computer case assembly, which includes a case body and an expansion module.

The case body includes an inner space. The case body further includes a hanging rack located in the inner space. The hanging rack at least includes a hanger part.

The expansion module is used to be installed in the inner space. The expansion module includes a transfer circuit-board, an expansion slot, a bottom-plate, a lateral-frame, a hanging groove, and a latch.

The transfer circuit-board at least includes an electrical connector disposed at an edge of the transfer circuit-board. The expansion slot is disposed on the transfer circuit-board and connected electrically to the electrical connector.

The transfer circuit-board is mounted onto the bottom-plate. The lateral-frame extends from the bottom-plate to define an accommodating space between the bottom-plate and the lateral-frame, and the transfer circuit-board is located in the accommodating space.

The hanging groove is formed on the lateral-frame. The hanger part of the hanging rack is used to be embedded into the hanging groove, so as to support and fix the lateral-frame in the case body. The latch is pivoted to the lateral-frame and moves between a releasing position and a latching position. The latch includes a first clamping element. At the latching position the first clamping element of the latch is set toward the accommodating space. When the interface card is placed into the accommodating space and inserted into the expansion slot, the latch clamps and fixes the interface card with the first clamping element at the latching position. The latch provides additional support to prevent the interface card from swiveling or escaping from the expansion slot.

One or more embodiment of this disclosure further provides a computer system, which includes a case body, a main circuit-board, a transfer circuit-board, an expansion slot, a bottom-plate, a lateral-frame, a hanging groove, an interface card, and a latch.

The case body includes an inner space defined therein, and a hanging rack is disposed to the case and located in the inner space. The hanging rack includes at least one hanger part. The main circuit-board is fixed to the case body and located in the inner space. The main circuit-board includes at least one card slot.

The transfer circuit-board includes an electrical connector disposed at an edge of the transfer circuit-board. The electrical connector is inserted into the card slot. The expansion slot is disposed on the transfer circuit-board and connected electrically to the electrical connector.

The transfer circuit-board is mounted onto the bottom-plate. The lateral-frame extends from the bottom-plate to define an accommodating space between the bottom-plate and the lateral-frame, and the transfer circuit-board is located in the accommodating space.

The hanging groove is formed on the lateral-frame. The hanger part of the hanging rack is used to be embedded into the hanging groove, so as to support and fix the lateral-frame in the case body.

The interface card is located in the accommodating space, inserted into the expansion slot, and connected electrically to the main circuit-board. The latch is pivoted to the lateral-frame and moves between a releasing position and a latching position. The latch includes a first clamping element. At latching position, the latch clamps and fixes the interface card with the first clamping element, so as to provide additional support to prevent the interface card from swiveling or escaping from the expansion slot.

According to embodiments of this disclosure, the latch clamps and fixes the interface card, so as to provide additional support. Consequently, the interface card is firmly fixed between the bottom-plate and the lateral-frame. Through the combination of the latch, the bottom-plate, and the lateral-frame, the expansion module prevents the interface card from swiveling toward the main circuit-board or escaping from the expansion slot, thus improving computer system operational stability.

BRIEF DESCRIPTION OF THE DRAWINGS

This disclosure will become more fully understood from the detailed description given herein below for illustration only, and thus not limitative of this disclosure, wherein.

DETAILED DESCRIPTION

Figure 1:
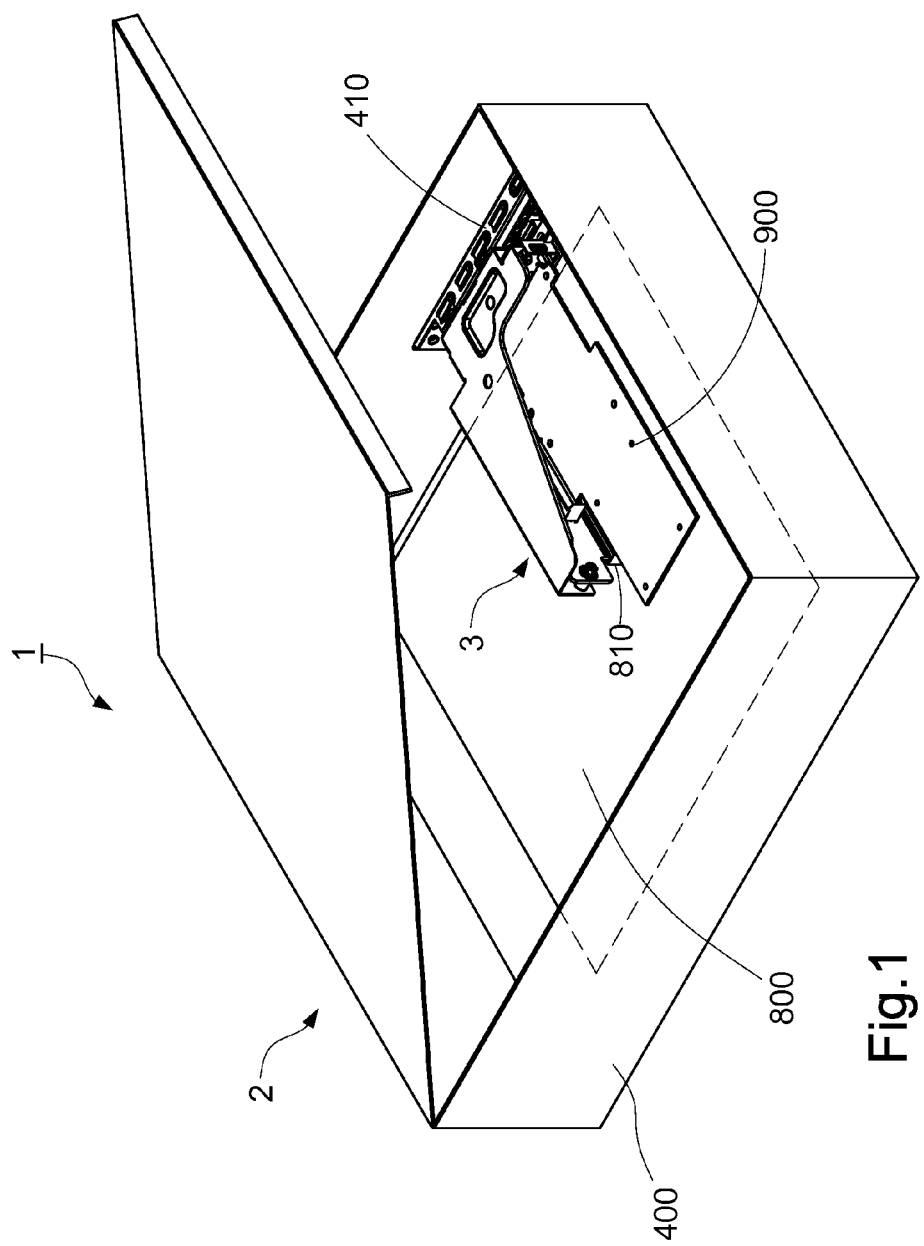
FIG. 1 is a perspective view of an embodiment.
Figure 2:
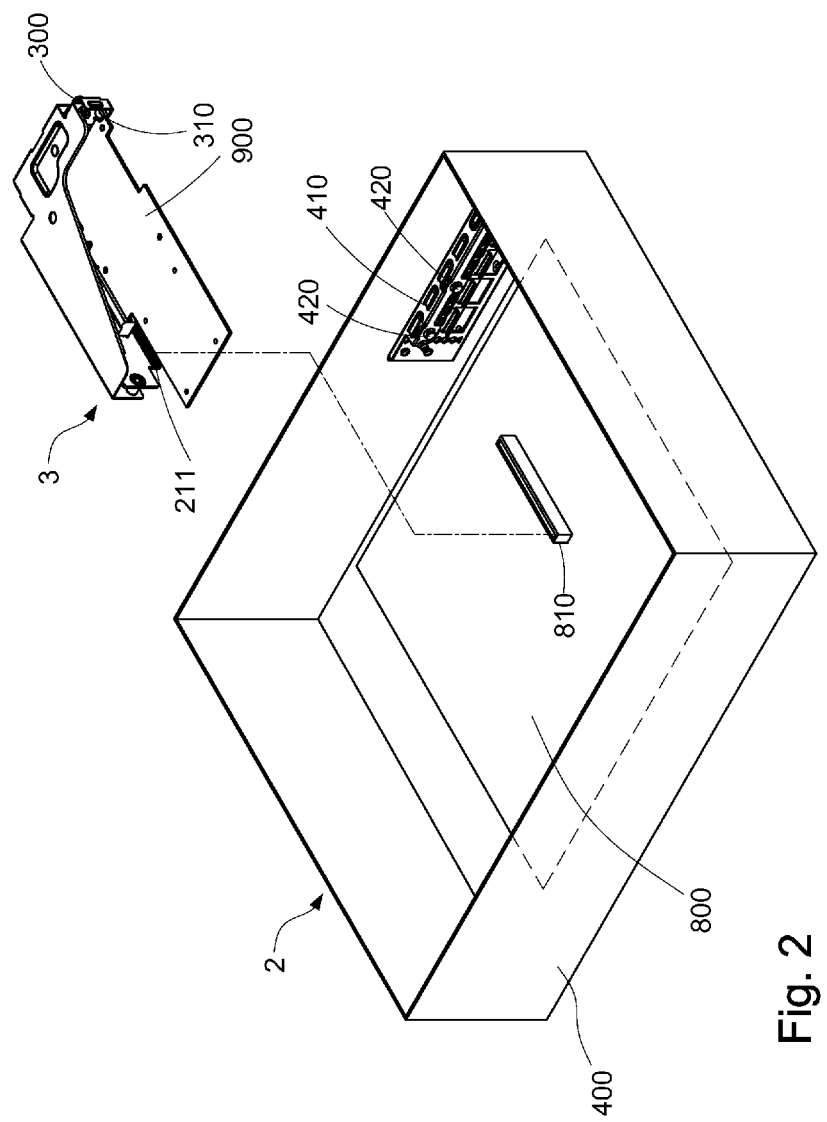
FIG. 2 is an exploding view of the embodiment.

Please refer to FIGS. 1 and 2, in which an expansion module 3 according to an embodiment of this disclosure is illustrated. The expansion module 3 is used for fixing an interface card 900 in a case body 400 of a computer case assembly 2 and electrically connecting the interface card 900 to a main circuit-board 800. An example of the main circuit-board 800 is a motherboard of a computer system 1, in which the main circuit-board 800 is disposed in the case body 400 and the main circuit-board 800 includes one or more card slots 810. All the card slots 810 are equipped corresponding to the interface card 900. The interface card 900 can be connected electrically to any one of the card slots 810, so as to be connected electrically to the main circuit-board 800.

Figure 3:
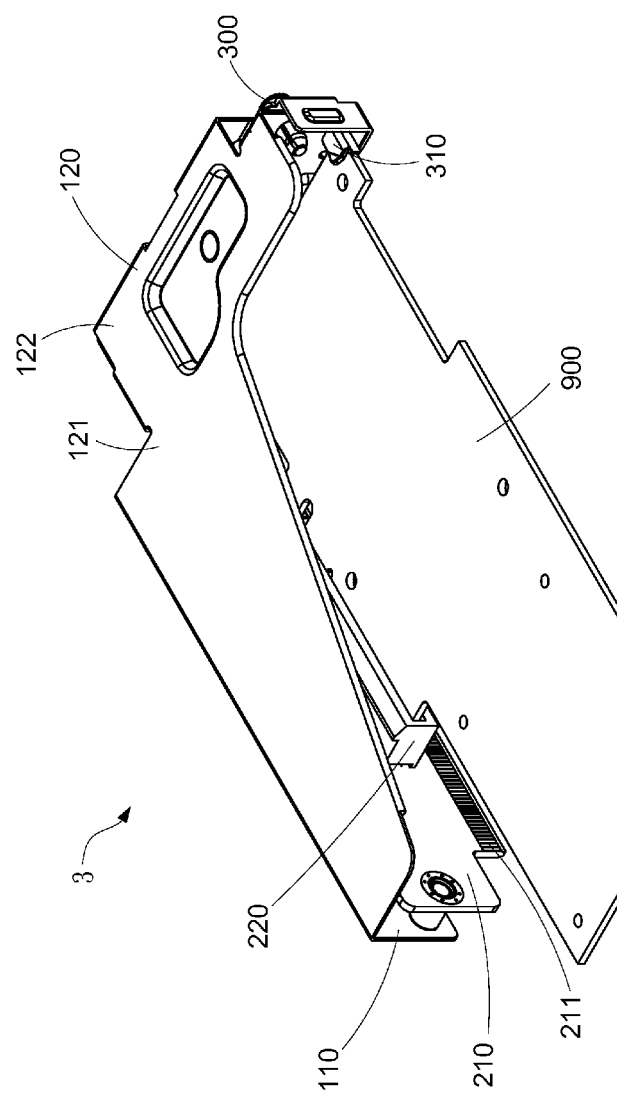
FIG. 3 is a perspective view of the expansion module according to the embodiment.
Figure 4:
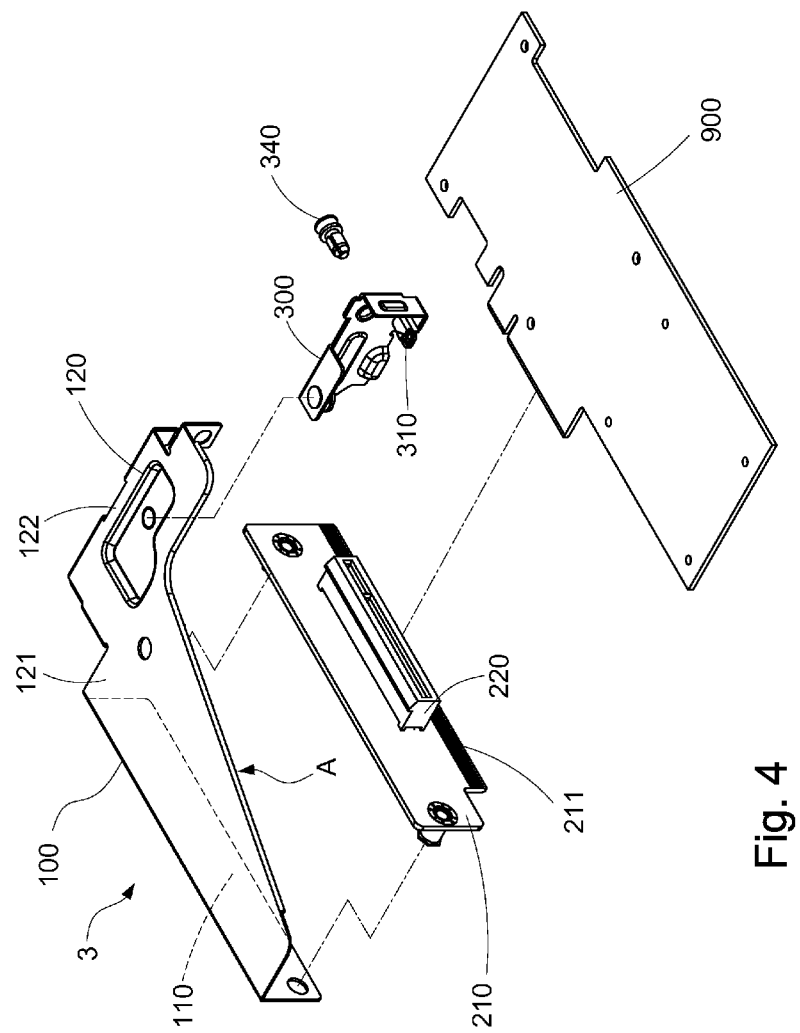
FIG. 4 is an exploding view of the expansion module according to the embodiment.

Please refer to FIGS. 3 and 4, in which the expansion module 3 includes a transfer circuit-board 210, an expansion slot 220, a carrier body 100, and a latch 300.

Figure 5:
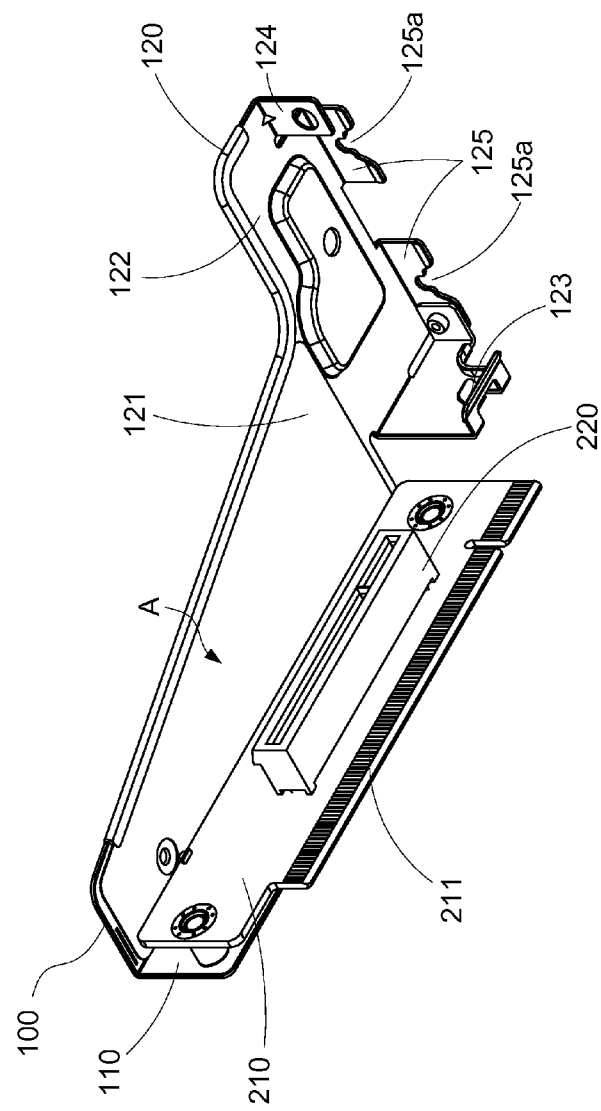
FIG. 5 is a perspective view of part of components of the expansion module according to the embodiment.

Please refer to FIGS. 4 and 5, in which the transfer circuit-board 210 includes an electrical connector 211. The electrical connector 211 is disposed at an edge of the transfer circuit-board 210 and is used to be inserted into the card slot 810. The expansion slot 220 is disposed on the transfer circuit-board 210 and is connected electrically to the electrical connector 211.

Please refer to FIGS. 4 and 5, in which the expansion slot 220 is used for the interface card 900 to be inserted into the expansion slot 220. Through the connection for the electrical connector 211 and the expansion slot 220, the transfer circuit-board 210 electrically connects the interface card 900 to main circuit-board 800. The transfer circuit-board 210 is disposed in the carrier body 100. When the interface card 900 is inserted into the expansion slot 220, the carrier body 100 also supports the interface card 900, so as to firmly fix the interface card 900. The carrier body 100 prevents the interface card 900 from escaping from the expansion slot 220.

Please refer to FIGS. 3, 4, and 5, in which the carrier body 100 provides an accommodating space A to accommodate the interface card 900. The carrier body 100 further includes a bottom-plate 110 and a lateral-frame 120. The transfer circuit-board 210 is mounted onto the bottom-plate 110 and located in the accommodating space A. The lateral-frame 120 extends from bottom-plate 110, so as to define the accommodating space A between the bottom-plate 110 and the lateral-frame 120.

Figure 6:
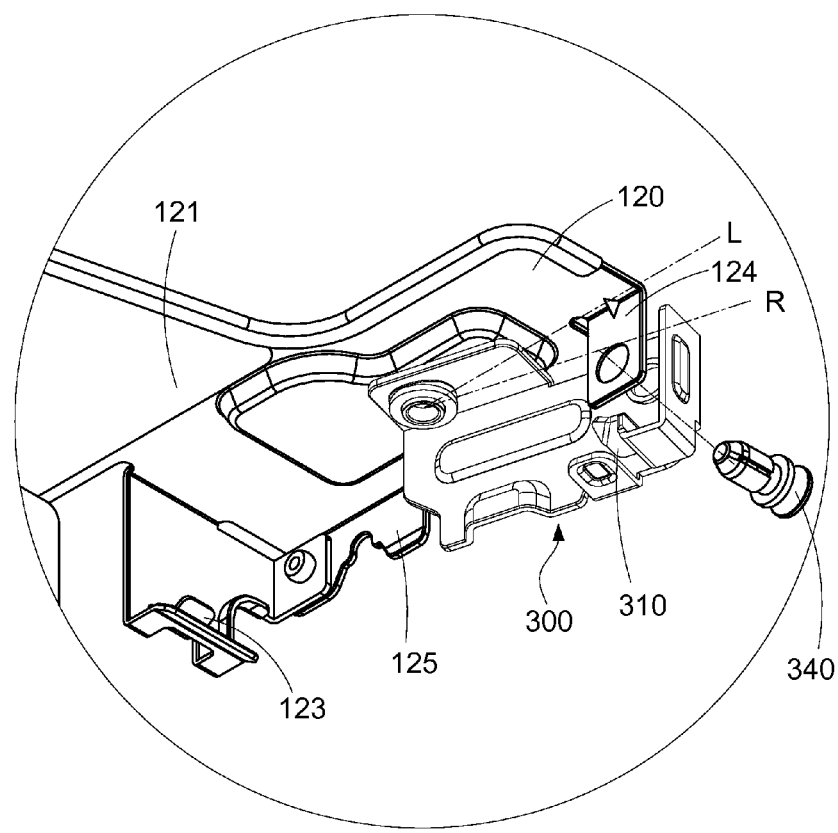
FIGS. 6, 7, and 8 are partial perspective views of the expansion module according to the embodiment.
Figure 7:
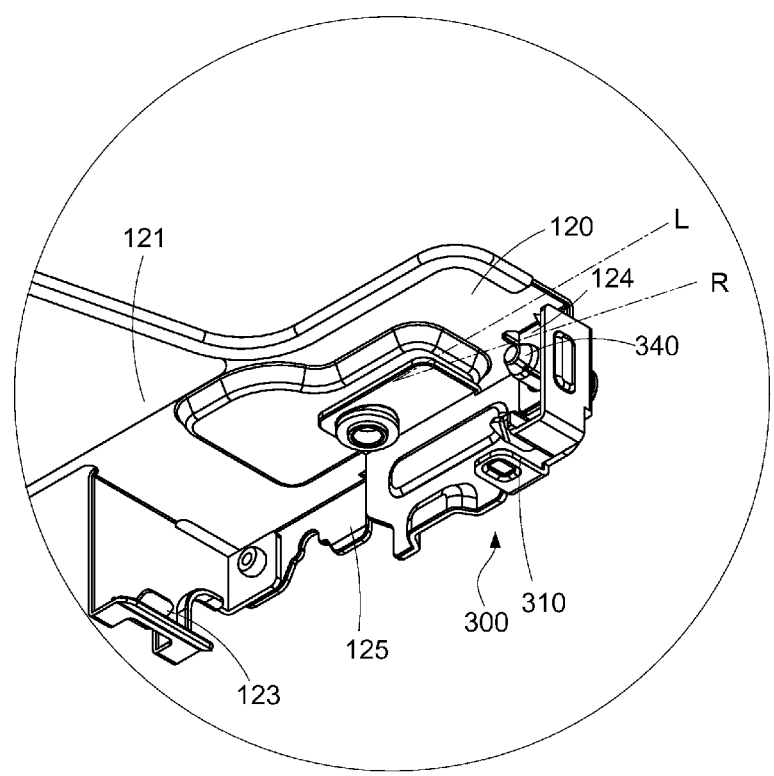

Please refer to FIGS. 6 and 7, in which the latch 300 is pivoted to the lateral-frame 120. The latch 300 is operated by a user to move between a releasing position R and a latching position L.

Please refer to FIGS. 4, 6 and 7, in which the latch 300 includes a first clamping element 310. When the latch 300 is operated by the user and moves to the latching position L, the first clamping element 310 is set toward the accommodating space A. At the latching position L the latch 300 clamps and fixes an edge of the interface card 900.

Figure 8:
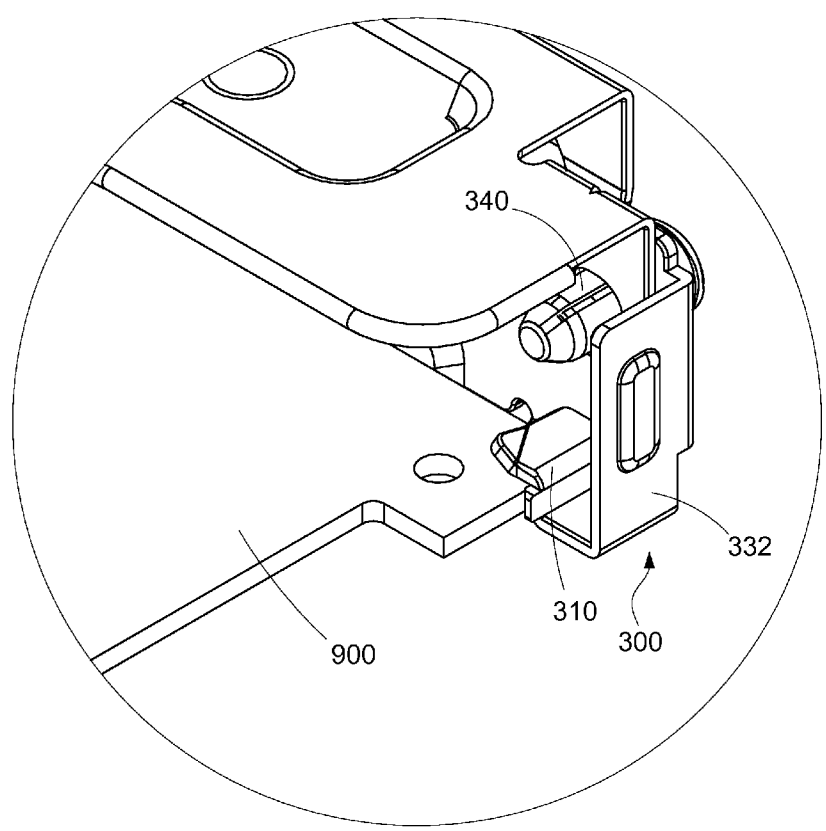

Please refer to FIGS. 1, 2, and 8, in which the carrier body 100 is used to be fixed to the case body 400 of the computer case assembly 2. When the interface card 900 is inserted into the expansion slot 220 and the electrical connector 211 of the transfer circuit-board 210 is inserted into the card slot 810 of the main circuit-board 800, the latch 300 clamps and fixes the interface card 900 with the first clamping element 310. The first clamping element 310 of the latch 300 provides additional support to the interface card 900, so as to firmly fix the interface card 900. When vibration, shock, or gravitational force is applied to the interface card 900, the carrier body 100 prevents the interface card 900 from swiveling toward the main circuit-board 800 or escaping from the expansion slot 220.

Please refer to FIG. 5, in which the lateral-frame 120 includes a connection portion 121 and a top plate 122. The connection portion 121 is connected to the bottom-plate 110. The top plate 122 extends from the connection portion 121 and is arranged perpendicular to the bottom-plate 110. The connection portion 121 is a bent plate, and the bent section is protruded into the accommodation space A. In an example, the top plate 122 extends to connect the bottom-plate 110. In example of fabrication for the carrier body 100, a planar metal plate is cut to an appropriate configuration. Through plate work and stamping process, the planar metal plate is shaped into the combination of the bottom-plate 110, the connection portion 121, and the top plate 122.

Please refer to FIGS. 4, 5, 6, and 7, in which the latch 300 is pivoted to the top plate 122 of the lateral-frame 120.

Figure 9:
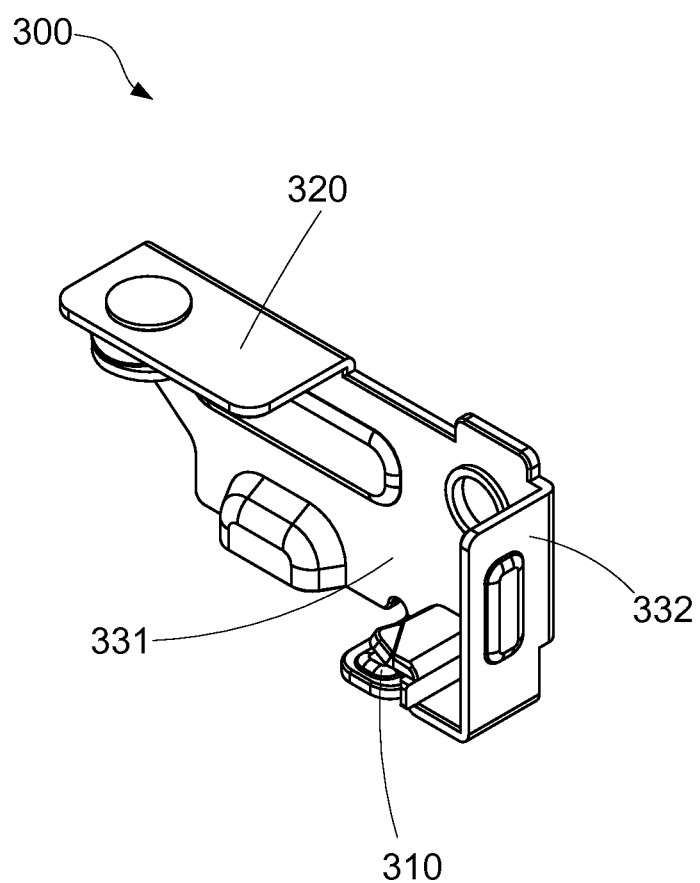
FIG. 9 is a perspective view of the latch according to the embodiment.

Please refer to FIG. 9, in which the latch 300 includes a pivoting piece 320, a first blocking piece 331, and a second blocking piece 332.

The pivoting piece 320 is pivoted to the top plate 122 of the lateral-frame 120 and located in parallel to the top plate 122, such that the latch 300 is pivoted to the lateral-frame 120. The first blocking piece 331 extends perpendicularly from the pivoting piece 320. The second blocking piece 332 extends perpendicularly from the first blocking piece 331, and the second blocking piece 332 is arranged perpendicular to the pivoting piece 320.

Please refer to FIGS. 8 and 9, in which the first blocking piece 331 and the second blocking piece 332 are used for respectively blocking two adjacent edges of the interface card 900, and the first clamping element 310 is disposed to the first blocking piece 331 or the second blocking piece 332.

The first clamping element 310 clamps one edge of the interface card 900 when the latch 300 moves to the latching position L. Meanwhile, the two adjacent edges of the interface card 900 are respectively blocked by the first blocking piece 331 and the second blocking piece 332. Consequently, the first clamping element 310 provides additional support to the interface card 900, and the first blocking piece 33 land the second blocking piece 332 prevent the interface card 900 from escaping from the expansion slot 220.

When the latch 300 moves to the releasing position R, the first clamping element 310 releases the interface card 900, and the first blocking piece 33 land the second blocking piece 332 also move away from the interface card 900. At this time, the interface card 900 can be removed from the expansion slot 220, or another interface card 900 can be inserted into the expansion slot 220.

Please refer to FIGS. 5, 6, and 7, in which the lateral-frame 120 further includes a second clamping element 123. The second clamping element 123 is disposed to the connection portion 121 and located in the accommodating space A. When the interface card 900 is inserted into the expansion slot 220, the second clamping element 123 clamps another edge of the interface card 900, so as to provide additional at a different position.

Please refer to FIGS. 5, 6, and 7, in which when the latch 300 is fixed at the latching position L, the interface card 900 is firmly fixed. In the expansion module 3 according to the embodiment, the lateral-frame 120 further includes a lug 124 and a back plate 125. The lug 124 extends from the top plate 122 and is located corresponding to the latching position L. The lug 124 blocks the first blocking piece 331 of the latch 300 at the latching position L. The back plate 125 extends from the top plate 122 and is located corresponding to releasing position R. The back plate 125 blocks the first blocking piece 331 of the latch 300 at the releasing position R; thus limited by the lug 124 and the back plate 125, the latch 300 only moves between the releasing position R and the latching position L.

When the latch 300 moves to the latching position L from the releasing position R, the first blocking piece 331 of the latch 300 contacts the lug 124. Furthermore, the expansion module 3 further includes a fixing part 340. An example of the fixing part 340 is a push-pin lock. The fixing part 340 is used for penetrating the first blocking piece 331 and being fixed to the lug 124, so as to fix the latch 300 at the latching position L. The push-pin lock one of the examples of the fixing part 340, in other examples, the fixing part 340 is a hook, a thumb screw, etc.

Figure 10:
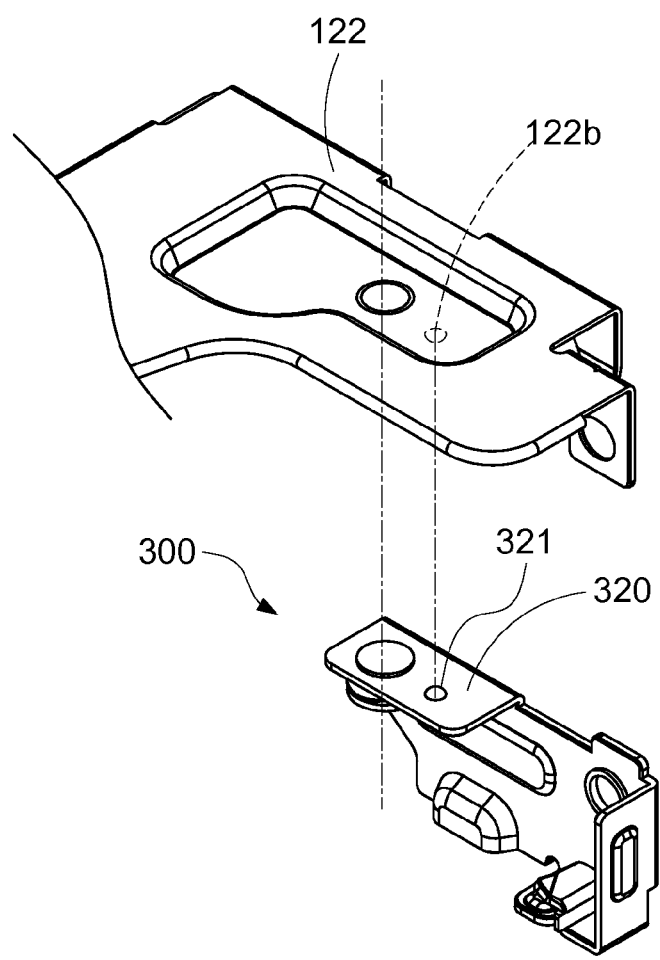
FIG. 10 is a partial perspective view of the expansion module according to the embodiment.

Please refer to FIG. 10, in which besides the fixing part 340, paired structures on the latch 300 and the lateral-frame 120 are applicable to temporarily or semi-permanently fix the latch 300 at the latching position L. In an example, a first positioning structure 321 is disposed on the pivoting piece 320 of the latch 300, and a second positioning structure 122b is disposed to the top plate 122 of the lateral-frame 120. The first positioning structure 321 and the second positioning structure 122b are combination of a bump and a dent respectively formed on the surfaces of the first blocking piece 331 and the top plate 12. When the latch 300 moves to the latching position L, the bump as the first positioning structure 321 is embedded into the dent as the second positioning structure 122b, so the first positioning structure 321 is engaged with the second positioning structure 122b to fix the latch 300 at the latching position L.

Figure 11:
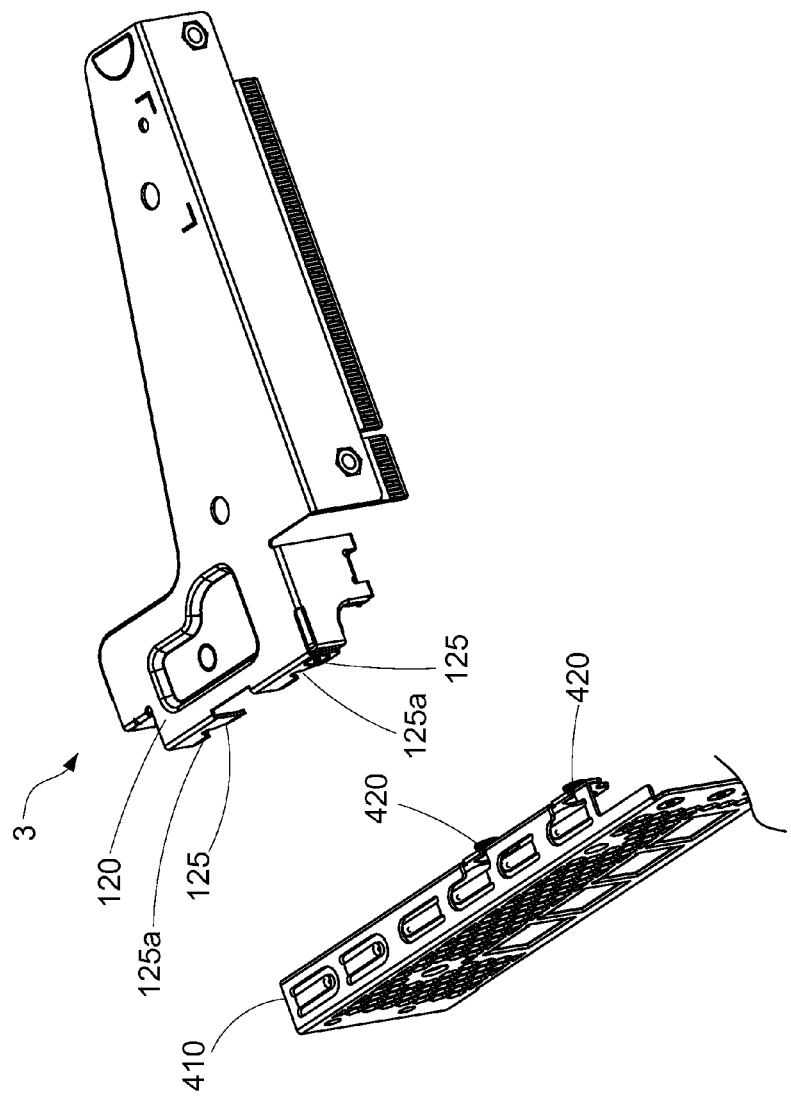
FIG. 11 is a partial perspective view of the computer case assembly according to the embodiment.

Please refer to FIGS. 1, 2, and 11, in which the embodiment of this disclosure further illustrates a computer case assembly 2 and a computer system 1. The computer case assembly 2 includes a case body 400 and the above-described expansion module 3.

Please refer to FIGS. 1, 2, and 11, in which the case body 400 includes an inner space defined therein. The case body 400 further includes a hanging rack 410 located in the inner space. The hanging rack 410 includes one or more hanger part 420. An example of the each hanger part 420 is a screw bolt, the bolt body is partially embedded into the hanging rack 410 and a gap exists between the bolt head and the hanging rack 410. In another example, the hanger part 420 is a combination of a post and a planar body; the post is partially inserted into the hanging rack 410, the planar body is connected to the exposed end of the post, and a gap exists between the planar body and the hanging rack 410.

As described previously, the expansion module 3 is used to be installed in the inner space. The expansion module 3 includes a transfer circuit-board 210, an expansion slot 220, a carrier body 100, and a latch 300. The carrier body 100 includes a bottom-plate 110 and a lateral-frame 120.

Corresponding to the hanging rack 410 and the hanger part 420, the carrier body 100 further includes a hanging groove 125a form on the lateral-frame 120. The hanger part 420 of the hanging rack 410 is used to be embedded into the hanging groove 125a, so as to support the carrier body in the case body 400. In an example, the hanging groove 125a is formed at an edge of the back plate 125 of the lateral-frame 120.

The computer system 1 includes the above-described case body 400, a main circuit-board 800, the above-described expansion module 3, and an interface card 900. The expansion module 3 includes a transfer circuit-board 210, an expansion slot 220, and a carrier body 100. The carrier body 100 includes a bottom-plate 110 and a lateral-frame 120.

Please refer to FIGS. 1 and 2; an example of the main circuit-board 800 is a motherboard of the computer system 1. The main circuit-board 800 is located in the inner space and fixed to the case body 400. Generally, the main circuit-board 800 includes one or more card slots 810; one card slot 810 is illustrated hereinafter to simplify the description.

Please refer to FIGS. 1 and 2; in the expansion module 3, the electrical connector 211 of the transfer circuit-board 210 is inserted into the card slot 810, therefore the expansion slot 220 is connected electrically to the main circuit-board 800 through the electrical connector 211 of the transfer circuit-board 210.

As described previously, the interface card 900 is inserted into the expansion slot 220 on the transfer circuit-board 210, so as to be connected to the main circuit-board 800 through the transfer circuit-board 210. As the electrical connector 211 of the transfer circuit-board 210 is inserted into the card slot 810, the lateral-frame 120 of the carrier body 100 is placed into the case body 400 and located corresponding to the hanging rack 410. The hanger part 420 of the hanging rack 410 is then embedded into the hanging groove 125*a*. The hanger part 420 and supports and fixes the carrier body 100 in the case body 400, so as to form the computer system 1.

The latch 300 clamps and fixes the interface card 900 to provide additional support, so as to firmly fix the interface card 900 in the carrier body 100. When vibration, shock, or gravitational force is applied to the interface card 900, the carrier body 100 prevents the interface card 900 from swiveling toward the main circuit-board 800 or escaping from the expansion slot 220, so as to improve the operation stability of the computer system 1.

While the present invention has been described by the way of example and in terms of the embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An expansion module for fixing an interface card and electrically connecting the interface card to a main circuit-board, wherein the main circuit-board comprises at least one card slot corresponding to the interface card, the expansion module comprising: a transfer circuit-board, comprising an electrical connector disposed at an edge of the transfer circuit-board to be inserted into the card slot; an expansion slot, disposed on the transfer circuit-board and connected electrically to the electrical connector, wherein the expansion slot is for the interface card to be inserted into the expansion slot and electrically connecting the interface card to the main circuit-board; and a carrier body, providing an accommodating space to accommodate the interface card, and comprising: a bottom-plate, wherein the transfer circuit-board is mounted onto the bottom-plate and located in the accommodating space; and a lateral-frame extending from the bottom-plate to define the accommodating space between the bottom-plate and the lateral-frame; and a latch, pivoted to the lateral-frame and moving between a releasing position and a latching position, wherein the latch comprises a first clamping element, a pivoting piece, a first blocking piece, and a second blocking piece, the pivoting piece being pivoted to the lateral-frame, the first blocking piece perpendicularly extending from the pivoting piece, the second blocking piece perpendicularly extending from the first blocking piece and being perpendicular to the pivoting piece; the first blocking piece and the second blocking piece being used for respectively blocking two adjacent edges of the interface card, and the first clamping element being disposed to one of the first blocking piece and the second blocking piece, and at the latching position the latch clamps and fixes the interface card with the first damping element.

2. The expansion module as claimed in claim 1, wherein the lateral-frame comprises:
a connection portion, connected to the bottom-plate; and
a top plate perpendicular to the bottom-plate, extending from the connection portion;
wherein the latch is pivoted to the top plate of the lateral-frame.

3. The expansion module as claimed in claim 2, wherein:
the lateral-frame further comprises a lug extending from the top plate and located corresponding to the latching position, for blocking the first blocking piece of the latch; and
the expansion module further comprises a fixing part for penetrating the first blocking piece and being fixed to the lug, so as to fix the latch at the latching position.

4. The expansion module as claimed in claim 3, wherein the lateral-frame further comprises a back plate extending from the top plate and located corresponding to the releasing position, for blocking the first blocking piece of the latch.

5. The expansion module as claimed in claim 4, wherein the pivoting piece of the latch comprises a first positioning structure and the top plate of the lateral-frame comprises a second positioning structure, and at the latching position the first positioning structure and the second positioning structure combined with each other to fix the latch.

6. The expansion module as claimed in claim 4, wherein the lateral-frame comprises a second clamping element disposed to the connection portion and located in the accommodating space, for clamping another edge of the interface card.

7. The expansion module as claimed in claim 6, wherein the connection portion is a bent plate protruded into the accommodating space.

8. The expansion module as claimed in claim 4, wherein the top plate extends to connect the bottom-plate.

9. A computer case assembly, comprising: a case body having an inner space defined therein, and a hanging rack is disposed to the case and located in the inner space; and the hanging rack comprising at least one hanger part; and an expansion module for fixing an interface card, used to be installed in the inner space, comprising: a transfer circuit-board, at least comprising an electrical connector disposed at an edge of the transfer circuit-board; an expansion slot disposed on the transfer circuit-board and connected electrically to the electrical connector; a bottom-plate, wherein the transfer circuit-board is mounted onto the bottom-plate; and a lateral-frame extending from the bottom-plate to define an accommodating space between the bottom-plate and the lateral-frame; wherein the transfer circuit-board is located in the accommodating space; a hanging groove, formed on the lateral-frame; wherein the hanger part of the hanging rack is used to be embedded into the hanging groove; and a latch, pivoted to the lateral-frame and moving between a releasing position and a latching position, wherein the latch comprises a first clamping element, a pivoting piece, a first blocking piece, and a second blocking piece, the pivoting piece being pivoted to the lateral-frame; the first blocking piece perpendicularly extending from the pivoting piece, the second blocking piece perpendicularly extending from the first blocking piece and being perpendicular to the pivoting piece; the first blocking piece and the second blocking piece being used for respectively blocking two adjacent edges of the interface card, and the first clamping element being disposed to one of the first blocking piece and the second blocking piece, and at the latching position the first clamping element of the latch is set toward the accommodating space.

10. The computer case assembly as claimed in claim 9, wherein the lateral-frame comprises:

a connection portion, connected to the bottom-plate;

a top plate perpendicular to the bottom-plate, extending from the connection portion; in which the latch is pivoted to the top plate of the lateral-frame; and a back plate extending from the top plate and located corresponding to the releasing position, for blocking the latch; wherein the hanging groove is formed at an edge of the back plate.

11. The computer case assembly as claimed in claim 10, wherein:

the lateral-frame further comprises a lug extending from the top plate and located corresponding to the latching position, for blocking the first blocking piece of the latch; and the expansion module further comprises a fixing part for penetrating the first blocking piece and being fixed to the lug, so as to fix the latch at the latching position.

12. The computer case assembly as claimed in claim 11, wherein the lateral-frame comprises a second clamping element disposed to the connection portion and located in the accommodating space, for clamping another edge of the interface card.

13. The computer case assembly as claimed in claim 10, wherein the top plate extends to connect to the bottom-plate.

14. A computer system, comprising: a case body having an inner space defined therein and a hanging rack is disposed to the case body and located in the inner space; and the hanging rack comprising at least one hanger part; a main circuit-board, fixed to the case body and located in the inner space, and having at least one card slot; a transfer circuit-board, comprising an electrical connector disposed at an edge of the transfer circuit-board; wherein the electrical connector is inserted into the card slot of the main circuit-board; an expansion slot disposed on the transfer circuit-board and connected electrically to the electrical connector; a bottom-plate, wherein the transfer circuit-board is mounted onto the bottom-plate; a lateral-frame extending from the bottom-plate to define an accommodating between the bottom-plate and the lateral-frame; wherein the transfer circuit-board is located in the accommodating space; a hanging groove, formed on the lateral-frame; wherein the hanger part of the hanging rack is used to be embedded into the hanging groove; an interface card, located in the accommodating space, inserted into the expansion slot, and connected electrically to the main circuit-board; and a latch, pivoted to the lateral-frame and moving between a releasing position and a latching position, wherein the latch comprises a first clamping element, a pivoting piece, a first blocking piece, and a second blocking piece, the pivoting piece being pivoted to the lateral-frame; the first blocking piece perpendicularly extending from the pivoting piece, the second blocking piece perpendicularly extending from the first blocking piece and being perpendicular to the pivoting piece; the first blocking piece and the second blocking piece being used for respectively blocking two adjacent edges of the interface card, and the first clamping element being disposed to one of the first blocking piece and the second blocking piece, and at the latching position the latch clamps and fixes the interface card with the first clamping element.

15. The computer system as claimed in claim 14, wherein the lateral-frame comprises:

a connection portion, connected to the bottom-plate;

a top plate perpendicular to the bottom-plate, extending from the connection portion; in which the latch is pivoted to the top plate of the lateral-frame; and a back plate extending from the top plate and located corresponding to the releasing position, for blocking the latch; wherein the hanging groove is formed at an edge of the back plate.

16. The computer system as claimed in claim 15, wherein:

the lateral-frame further comprises a lug extending from the top plate and located corresponding to the latching position, for blocking the first blocking piece of the latch; and the expansion module further comprises a fixing part, for penetrating the first blocking piece and being fixed to the lug, so as to fix the latch at the latching position.

17. The computer system as claimed in claim 16, wherein the lateral-frame comprises a second clamping element disposed to the connection portion and located in the accommodating space, for clamping another edge of the interface card.

* * * * *